(12) United States Patent
Schottner et al.

(10) Patent No.: US 7,576,934 B2
(45) Date of Patent: Aug. 18, 2009

(54) GROUPWISE CORRECTED OBJECTIVE

(75) Inventors: Michael Schottner, Leimen (DE);
Hans-Jurgen Mann, Oberkochen (DE);
Martin Lowisch, Oberkochen (DE)

(73) Assignee: Carl Zeiss SMT AG, Oberkochen (DE)

( * ) Notice: Subject to any disclaimer, the term of this patent is extended or adjusted under 35 U.S.C. 154(b) by 115 days.

(21) Appl. No.: 11/656,878

(22) Filed: Jan. 23, 2007

(65) Prior Publication Data
US 2007/0195317 A1 Aug. 23, 2007

(30) Foreign Application Priority Data
Jan. 24, 2006 (DE) .................... 10 2006 003 375

(51) Int. Cl.
*G02B 27/00* (2006.01)
(52) U.S. Cl. .................... 359/896; 359/650; 359/900
(58) Field of Classification Search ......... 359/649–651, 359/686–692
See application file for complete search history.

(56) References Cited

U.S. PATENT DOCUMENTS

| 5,696,631 | A | * | 12/1997 | Hoffman | ................... 359/649 |
|---|---|---|---|---|---|
| 6,268,903 | B1 | | 7/2001 | Chiba | |
| 6,678,240 | B2 | | 1/2004 | Geh et al. | |
| 6,934,011 | B2 | | 8/2005 | Geh et al. | |
| 2005/0254042 | A1 | | 11/2005 | Geh et al. | |

FOREIGN PATENT DOCUMENTS

DE 10146499 B4 11/2006

* cited by examiner

*Primary Examiner*—Darryl J Collins
(74) *Attorney, Agent, or Firm*—Lando & Anastasi, LLP

(57) ABSTRACT

An objective and method of fabricating an objective, particularly a projection objective for microlithography, comprising a plurality of optical elements. In one example, the method comprises acts of determining groups of optically similar optical elements or surfaces having at least two members, determining wave front deformations by the optical elements or surfaces, determining the necessary corrections for the optical elements or surfaces of a group, and performing the corrections for a group at a group member.

10 Claims, 1 Drawing Sheet

GROUPWISE CORRECTED OBJECTIVE

BACKGROUND

1. Field of the Invention

The present invention relates to objectives, particularly projection objectives, and to a method of fabricating an objective.

2. Discussion of Related Art

For the fabrication of components such as circuits and the like in microelectronic applications, microlithographic techniques are employed making use of high-accuracy objectives particularly in the field of projection illumination systems. The ever increasing miniaturization makes it necessary to resort to ever smaller wavelengths for the projection light employed in projection illumination systems, now resulting in projection light in the spectral range of extreme ultraviolet (EUV) light being employed. The wavelengths involved are in the range of very few to a few 10 nm, particularly in the range of about 13.5 nm. In addition to higher demands on the accuracy this also involves the use of catoptric systems.

In general, however, with projection objectives which may also work with longer wavelength projection light, there is the requirement that the projection objectives should ensure highly exact images, and correspondingly, aberrations should be maintained at extremely low levels.

Aberrations may result from the design of the projection objective, i.e., the arrangement and orientation of the various optical elements such as refractive optical elements, in other words lenses, or reflective optical elements such as mirrors. In addition, aberrations due to fabrication and/or material defects of the optical elements, or the optical surfaces defining them, should also be particularly taken into account. Some aberrations that should be particularly accounted for are misshapings, the so-called form errors both for lenses and for mirrors that involve departures from the ideal shape or surface because of production tolerances. To be additionally taken into account, especially with lenses, are material defects as may exist, for example, due to localized fluctuations in the properties of the material, such as, for example, the refractive index.

One method to correct such aberrations due to fabrication or material defects is discussed in U.S. Pat. No. 6,268,903 B1 in which the surface of the optical elements is remachined to correct for aberrations due to fabrication and/or material defects. Such remachining methods are also described in the German paper by C. Hofmann et al entitled "Nanometer Asphären: wie herstellen und wofür" in the magazine "Feinwerktechnik und Messtechnik," 99 (1991), 10, pages 437-440. Both the content of the above-mentioned article by C. Hoffmann et al and that of U.S. Pat. No. 6,268,903 B1 (or corresponding DE 696 14 007) are incorporated as content and subject matter of the present application by reference.

DE 103 60 414 BI describes in relation to an EUV projection objective how the ready assembled and adjusted EUV projection objective is gauged and, subsequently how the surface of one or more mirrors can be remachined so that certain imaging properties of the projection objective are improved. This, however, involves the problem that the mirrors are usually coated and thus that remachining could cause localized detriments to the reflectivity of the mirrors. This problem is taken into account in DE 103 60 414 by only one mirror being corrected before coating. The content and subject matter of DE 103 60 414 is likewise incorporated by reference in the present application. In addition, U.S. 60/578522 or PCT/EP2005/005930 discuss which optical elements are particularly suitable for correction. According to these documents, at least two optical elements arranged in different sections of an objective are to be corrected, the sections being divided by pupil planes or intermediate image planes disposed in-between. The two corrected optical elements are to be arranged in sections in which the absolute value of the difference in the section numbers is an odd number.

Although known prior art already makes it possible to achieve a very good correction of aberrations due to fabrication and/or material defects there continues to be a need to attain a compromise between the conflicting interests of achieving an optimized correction on the one hand and on the other minimizing the expense involved.

SUMMARY OF THE INVENTION

According to aspects and embodiments of the present invention, there are proposed a method of fabricating an objective, particularly a projection objective, for microlithograhy and preferably a projection objective working with EUV light, and also a corresponding objective permitting, on the one hand, an optimized correction of aberrations due to fabrication and/or material defects and, on the other hand, production at relatively low expense.

According to one embodiment, there is provided a method of fabricating an objective comprising a plurality of optical elements. The method may comprise acts of:
a) determining groups of optically similar optical elements or surfaces, each group having at least two members;
b) determining wavefront deformations by the optical elements or surfaces;
c) determining necessary corrections for the optical elements or surfaces of at least one of the groups; and
d) performing corrections for the at least one group at a group member of that group.

BRIEF DESCRIPTION OF THE DRAWINGS

Further advantages, characteristics and features of the present invention will now be rendered clear by way of the following detailed description with reference to the accompanying FIGURE.

DETAILED DESCRIPTION

Figure 1:
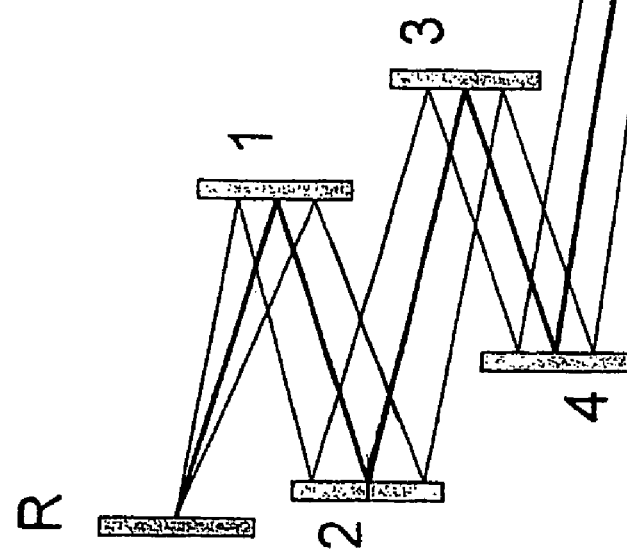
FIG. 1 is a schematic diagram of a catoptric projection system on which the correction in accordance with aspects of the present invention can be performed.
Figure 1:
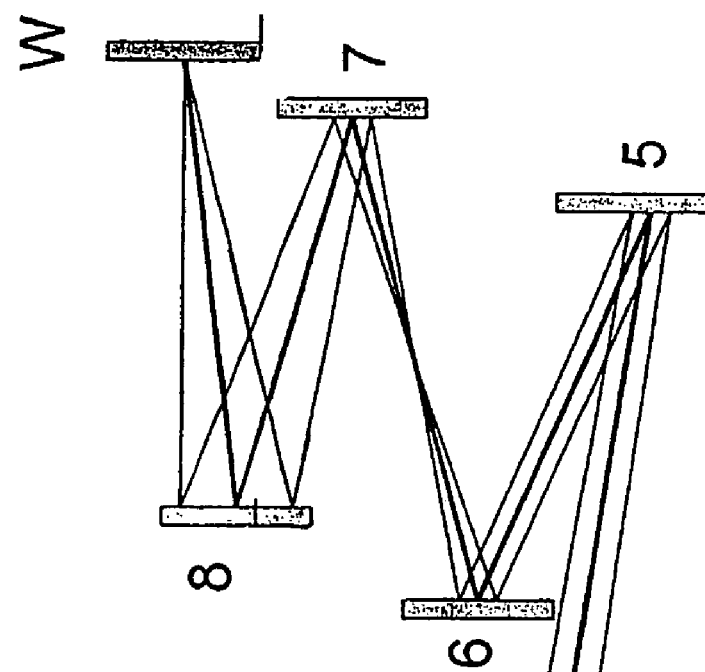

In accordance with an embodiment of the present invention, a correction of aberrations due to fabrication and/or material defects may be accomplished in that groups of optically similar optical elements or surfaces having at least two members are determined, the necessary correction for the optical elements or surfaces of a group being implemented on a group member. This now makes it possible to achieve a better correction than is possible with known methods in which only two or three surfaces to be remachined are provided for correction of the objective or in the extreme case, even just a single surface is provided for machining. Methods according to the invention may be implemented with catadioptric systems (in which hitherto, as discussed in DE 103 60 414, preferably only one mirror is corrected), as well as with catoptric systems having a so-called off axis field. Embodiments of the invention may thus provide a significant improvement in the correction, since one to three corrected optical elements or optical surfaces in systems having special requirements such as the shape of the optically used surfaces, the pupil or field closeness and the spacing of the optical element from the optical axis, may not be sufficient. At the same time, however, the expense may be minimized since now only a corrected group member may be needed for each group of similar optical elements or surfaces.

Preferably, according to one embodiment, the similarity of the optical elements for determining the group is defined by the identity or similarity of the optical position of the optical elements. For this purpose, the shape of the surfaces as optically used, the pupil or field closeness and the spacing of the optical element from the optical axis and the like can be used. In particular it is advantageous to determine the similarity of the optical elements for determining the group by the pupil closeness and/or arrangement of the optical elements before and behind the pupil.

In this arrangement the pupil closeness is preferably determined by the ratio of the subaperture diameter to the optical free diameter. A similarity can thus be defined by stating that the optical elements are to be viewed as being similar when the pupil closeness as given by the ratio of the subaperture diameter to the optical free diameter relative to the maximum value of the values as compared differs by less than 30%, or particularly by less than 20%, and preferably, in one embodiment, by less than 10%. This achieves that groups of at least two members are formed, only one of which may be subjected to the correction, i.e. also or just for the other group member(s). In other words, this means that an optical element, or a corresponding optical surface, is assigned or conjugated with at least one other optical element or surface, and the correction of aberrations due to fabrication and/or material defects of the conjugated optical element may be effected at the group member assigned thereto. This now makes it possible to effectively correct aberrations due to fabrication and/or material defects whilst limiting the expense thereof.

The optical elements of the objective, particularly projection objectives for microlithography can be refractive and/or reflective elements, i.e. optical lenses and/or mirrors. It is particularly in catadioptric or catoptric systems making partial or exclusive use of mirrors as optical elements and especially with EUV projection objectives that the method in accordance with the invention is of advantage since the mirrors of EUV projection objectives are usually coated to be reflective for the wavelength employed. It is here with such coated optical elements that remachining to correct aberrations due to fabrication and/or material defects is only possible with difficulties because of negative impact on the reflectivity. Now, however, with the method in accordance with the invention in one preferred embodiment it is possible to perform determining the wavefront deformation, as the basis for the correction, individually for each optical element. There no longer is the need to examine the system wavefront of the assembled objective, but instead it now being particularly possible to detect the reasons for aberrations due to fabrication and/or material defects by surface and/or material examination. For this purpose use can be made particularly of interferometric techniques to detect deviations of the surface from a predefined shape (form errors) as well as tomographic techniques to detect localized fluctuations in the material properties.

This also now makes it possible to dispense with assembling the optical elements into an objective, since there is no need to examine the system wavefront. This has the advantage that laborious assembling of the objective and replacement of the corrected optical elements can be avoided. Instead, the optical elements can now be examined individually and the correction of defects due to material and shaping of the members of a group or an optical element is achieved by correcting just a single group member or the assigned or conjugated other optical element.

In accordance with another embodiment all group members except for the one to be corrected can now be already fully fabricated, for instance corresponding mirrors provided with a coating. Determining the wavefront deformation due to fabrication and/or material defects can then be done already in the fully fabricated, i.e. finished condition, representing a further advantage.

As an alternative or in addition thereto, a plurality of optical elements, e.g. the elements of a group or all optical elements of the objective, can be examined together as to wavefront deformation as described in prior art. Preferably a combination can be done for the purpose of firstly implementing in accordance with the invention a groupwise correction of the optical elements with a preceding component examination of the individual elements, and then additionally performing a further correction as described, for example, in DE 103 60 414 A1, afterwards.

The correction, as described in prior art, is likewise done by correspondingly altering the surfaces of the optical element or optical surface particularly by means of aspherical machining, preferably by localized material erosion. Preferably, especially with reflective elements, which need to be coated with a reflective coating, correcting the optical element concerned is performed before application of the coating.

Preferably, the optical elements to be corrected can be additionally also determined according to the region of the objective in which they are arranged, since it is known that corrections of an optical surface can reduce or even eliminate aberrations regionally. In particular, in this arrangement the objective can be divided into N sections and pupil planes or intermediate image planes provided between the sections. The corrected optical elements in accordance with the invention may then preferably be located in sections in which the absolute value of the difference of the section numbers is an odd number.

Similarly, it can be additionally defined how the conjugated or grouped optical elements can be selected. This may be preferably done, such that a corrected element and the optical element conjugated thereto are in sections whose absolute value of the difference of the section numbers equals an even number or zero. This makes it possible with the present method or with the objective fabricated thereby to achieve a particularly effective correction of aberrations due to fabrication and/or material defects at minimum expense.

Referring to FIG. 1, there is illustrated a catoptric projection system in which the reticle R is imaged on the wafer W via a projection objective including a total of eight mirrors 1 to 8. By the method in accordance with embodiments of the invention, due to the pupil closeness and the position to the pupil, firstly groups of mirrors may be formed which are accessible for a groupwise correction. The following table lists which mirror comprises which pupil closeness and position to the pupil and with which mirror aberrations due to fabrication and/or material defects would permit correction.

TABLE 1

| Mirror | Pupil closeness | Position to pupil | Good correctable with mirror no. |
|---|---|---|---|
| 1 | medium | 60% before | 7 |
| 2 | very high | 100% in | 8 |
| 3 | medium | 60% behind | 4 |
| 4 | medium | 50% Behind | 3, 5 |

TABLE 1-continued

| Mirror | Pupil closeness | Position to pupil | Good correctable with mirror no. |
|---|---|---|---|
| 5 | low | 40% Behind | 4, 6 |
| 6 | very low | 30% Behind | 5 |
| 7 | medium | 60% Before | 1 |
| 8 | high | 90% Behind | 2 |

It follows from Table 1 that mirror 1 comprises a mean pupil closeness with a ratio of subaperture diameter to optical free diameter of 60% and is arranged before the pupil. Mirror 7 has a similar optical position so that mirrors 1 and 7 can form a group.

With mirror 2, the pupil closeness is 100% according to the ratio of subaperture diameter to optical free diameter, and the position is directly in the pupil. Although there is no identical mirror arrangement in the objective, mirror 8 features a high pupil closeness of 90% so that the mirrors 2 and 8 can form a group. The mirrors 3 and 4 have a mean pupil closeness of 60% and 50% respectively and are arranged behind the pupil, so that they can form a group just like the mirrors 5 and 6 with a low and very low pupil closeness of 40% and 30% respectively in an arrangement behind the pupil. In these groups of two mirrors each the correction of aberrations due to fabrication and/or material defects, preferably of shape defects due to fabrication in the case of mirrors, is possible by correcting one mirror of the mirror pair. It is particularly in this case that the mirror selected for correction may be the one less difficult to fabricate, i.e. with which, for example, the necessary surface accuracy is attainable at less expense.

Since in accordance with Table 1 mirror 4 is not only correctable with mirror 3, but also with mirror 5, whilst mirror 5 is also correctable with mirror 4, a group could be formed of mirrors 3, 4 and 5 since these mirrors additionally reside in a section of the objective. As described above, the sections formed by the pupil planes or intermediate image planes can be likewise made use of for selecting the optical elements to be corrected. In one example, in this group mirror 4 could be corrected for the mirrors 3 and 5.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only and the scope of the invention should be determined from proper construction of the appended claims.

What is claimed is:

1. A method of fabricating an objective comprising a plurality of optical elements, the method comprising acts of:
   determining groups of optically similar optical elements or surfaces, each group having at least two members;
   determining wave front deformations by the optical elements or surfaces;
   determining necessary connections for the optical elements or surfaces of at least one of the groups; and
   performing corrections for the at least one group at a group member of that group;
   wherein the act of determining groups includes:
   determining similarity of the optical elements or surfaces; and
   grouping the optical elements or surfaces according to the similarity of their optical positions;
   wherein similarity of the optical elements or surfaces for determining a group is determined by at least one of pupil closeness and arrangement of the optical elements or surfaces before or behind a pupil; and
   wherein pupil closeness is determined by the ratio of subaperture diameter to optical free diameter.

2. The method as set forth in claim 1, wherein optical elements or surfaces are termed similar when their pupil closeness relative to the maximum value of the values being compared differs by less than 30%.

3. The method as set forth in claim 1 wherein optical elements or surfaces are termed similar when their pupil closeness relative to the maximum value of the values being compared differs by less than 20%.

4. The method as set forth in claim 1, wherein optical elements or surfaces are termed similar when their pupil closeness relative to the maximum value of the values being compared differs by less than 10%.

5. A method of fabricating an objective comprising a plurality of optical elements, the method comprising acts of:
   determining groups of optically similar optical elements or surfaces, each group having at least two members;
   determining wave front deformations by the optical elements or surfaces;
   determining necessary co-corrections for the optical elements or surfaces of at least one of the groups;
   performing corrections for the at least one group at a group member of that group; and
   examining a surface of each optical element;
   wherein the act of examining the surface includes using an interferometric technique to determine deviations of the surface from a predefined shape.

6. A method of fabricating an objective comprising a plurality of optical elements, the method comprising acts of:
   determining groups of optically similar optical elements or surfaces, each group having at least two members;
   determining wavefront deformations by the optical elements or surfaces; determining necessary corrections for the optical elements or surfaces of at least one of the groups; and
   performing corrections for the at least one group at a group member of that group; and
   examining a material of each optical element;
   wherein the act of examining the material includes using tomographic techniques to detect localized fluctuations in properties of the material.

7. A method of fabricating an objective comprising a plurality of optical elements, the method comprising acts of:
   determining groups of optically similar optical elements or surfaces, each group having at least two members;
   determining wavefront deformations by the optical elements or surfaces;
   determining necessary corrections for the optical elements or surfaces of at least one of the groups; and
   performing corrections for the at least one group at a group member of that group;
   wherein the act of determining wavefront deformations includes:
   determining the wavefront deformation for a group member that is to be corrected when that group member is in an unfinished condition; and
   determining the wavefront deformation for all other group members in the finished condition after coating.

8. A method of fabricating an objective comprising a plurality of optical elements, the method comprising acts of:

determining groups of optically similar optical elements or surfaces, each group having at least two members;

determining wavefront deformations by the optical elements or surfaces;

determining necessary corrections for the optical elements or surfaces of at least one of the groups; and performing corrections for the at least one group at a group member of that group wherein the optical elements are provided in sections separated by pupil planes or intermediate image planes; wherein N sections $A_1$ to $A_N$ are provided with N being at least 2; wherein a first corrected optical element is provided in section $A_j$, where j=1 to N; and wherein at least a second corrected optical element is provided in section $A_k$, where k=1 to N in satisfying the condition |k-j| equals an odd number.

9. A method of fabricating an objective comprising a plurality of optical elements, the method comprising acts of:

determining groups of optically similar optical elements or surfaces, each group having at least two members;

determining wavefront deformations by the optical elements or surfaces;

determining necessary corrections for the optical elements or surfaces of at least one of the groups; and performing corrections for the at least one group at a group member of that group wherein the optical elements are provided in sections separated by pupil planes or intermediate image planes; wherein N sections $A_1$ to $A_N$ are provided with N being at least 2; and wherein a co-corrected optical element is provided in section $A_j$ where j=1 to N, which corrects or co-corrects at least a similar optical element in section $A_k$ where k=1 to N in satisfying the condition |k-j| equals an even number or zero.

10. An objective comprising:

a plurality of optical elements, grouped together into groups of optically similar elements, each group having at least two members;

wherein at least one group comprises an optical element constructed and arranged to correct a wave front deformation of at least one of a correspondingly corrected optical element and the group members of the at least one group; and wherein the objective is an EUV projection objective.

\* \* \* \* \*

UNITED STATES PATENT AND TRADEMARK OFFICE
CERTIFICATE OF CORRECTION

PATENT NO. : 7,576,934 B2 Page 1 of 1
APPLICATION NO. : 11/656878
DATED : August 18, 2009
INVENTOR(S) : Michael Schottner et al.

It is certified that error appears in the above-identified patent and that said Letters Patent is hereby corrected as shown below:

On the title page item (57), line 6, in the Abstract, "wave front" should be changed to --wavefront--
In column 1, line 54, "DE 103 60 414 BI" should be changed to --DE 103 60 414 B1--
In column 5, line 59, in claim 1, "wave front" should be changed to --wavefront--
In column 5, line 61, in claim 1, "connections" should be changed to --corrections--
In column 6, line 13, in claim 3, "claim 1" should be changed to --claim 1,--
In column 6, line 25, in claim 5, "wave front" should be changed to --wavefront--
In column 6, line 27, in claim 5, "co-corrections" should be changed to --corrections--
In column 8, line 8, in claim 9, "co-corrected" should be changed to --corrected--
In column 8, line 18, in claim 10, "wave front" should be changed to --wavefront--

Signed and Sealed this

Twenty-second Day of December, 2009

David J. Kappos
*Director of the United States Patent and Trademark Office*